(12) United States Patent
Tabib-Azar

(10) Patent No.: US 8,729,412 B2
(45) Date of Patent: May 20, 2014

(54) NANOELECTROMECHANICAL LOGIC DEVICES

(75) Inventor: Massood Tabib-Azar, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 745 days.

(21) Appl. No.: 12/987,804

(22) Filed: Jan. 10, 2011

(65) Prior Publication Data

US 2014/0021982 A1    Jan. 23, 2014

Related U.S. Application Data

(63) Continuation-in-part of application No. 12/943,575, filed on Nov. 10, 2010, now Pat. No. 8,563,885.

(60) Provisional application No. 61/260,283, filed on Nov. 11, 2009.

(51) Int. Cl.
*H01H 57/00* (2006.01)

(52) U.S. Cl.
USPC .......................................... 200/181; 326/104

(58) Field of Classification Search
USPC ..................................... 200/181; 326/104, 53
See application file for complete search history.

(56) References Cited

U.S. PATENT DOCUMENTS

| | | | |
|---|---|---|---|
| 6,100,477 A | 8/2000 | Randall et al. | |
| 6,867,467 B2 | 3/2005 | Yang et al. | |
| 7,209,019 B2 * | 4/2007 | Nakanishi et al. | 335/78 |
| 7,521,736 B2 | 4/2009 | Rueckes et al. | |
| 7,719,318 B1 | 5/2010 | Nordquist et al. | |
| 7,795,778 B2 * | 9/2010 | Ikehashi | 310/309 |
| 8,022,732 B2 * | 9/2011 | Nugent | 326/104 |
| 8,044,552 B2 * | 10/2011 | Ikehashi | 310/309 |
| 8,138,655 B2 * | 3/2012 | Ikehashi et al. | 310/309 |
| 2005/0035786 A1 | 2/2005 | Bertin et al. | |
| 2008/0233744 A1 | 9/2008 | Kaul et al. | |
| 2010/0140066 A1 | 6/2010 | Feng et al. | |

FOREIGN PATENT DOCUMENTS

WO    WO 03096368    11/2003

OTHER PUBLICATIONS

U.S. Appl. No. 12/934,575, filed Nov. 10, 2010, Massood Tabib-Azar.

* cited by examiner

*Primary Examiner* — Vanessa Girardi
(74) *Attorney, Agent, or Firm* — Fulbright & Jaworski LLP

(57) ABSTRACT

Nanoelectromechanical logic devices can include a plurality of flexible bridges having control and logic electrodes. Voltages applied to control electrodes can be used to control flexing of the bridges. The logic electrodes can provide logical functions of the applied voltages.

17 Claims, 7 Drawing Sheets

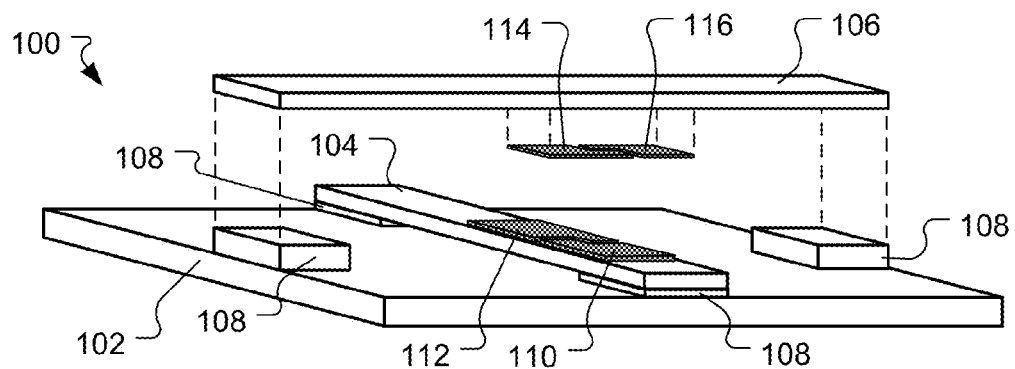
FIG. 1D
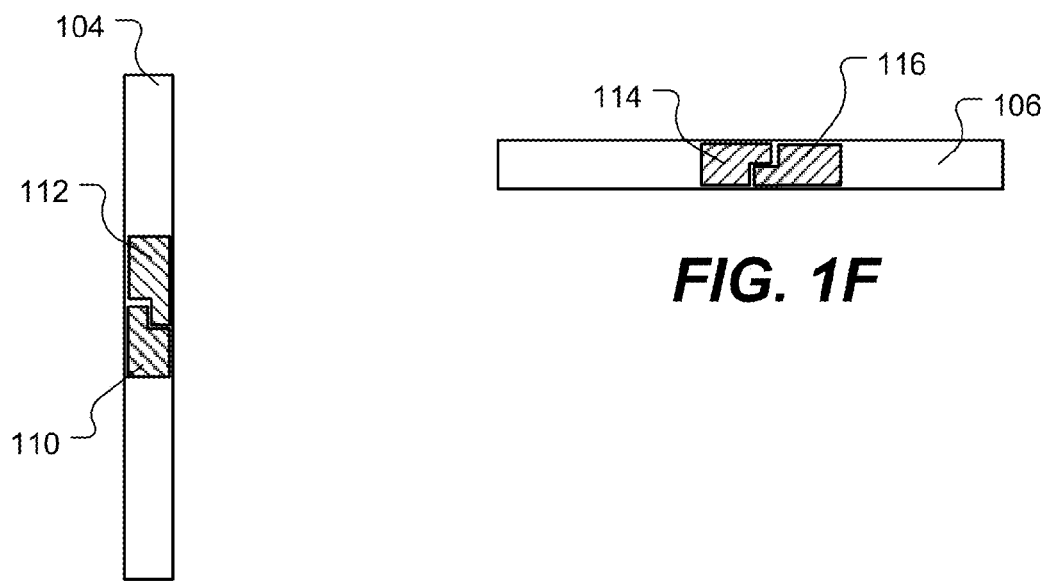
FIG. 1E
FIG. 1F

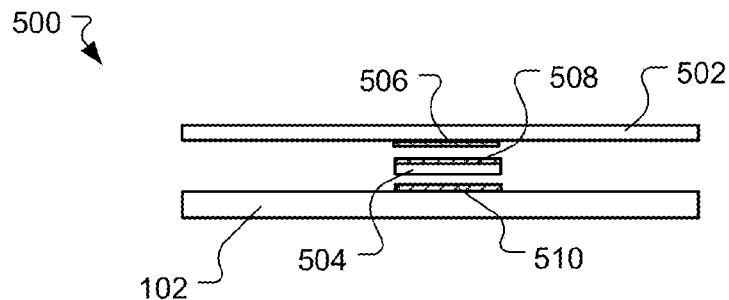
FIG. 5
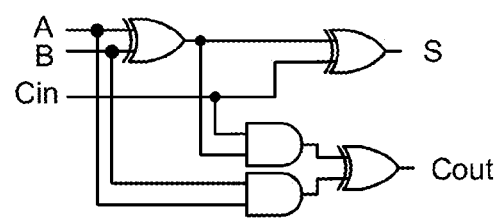
FIG. 6
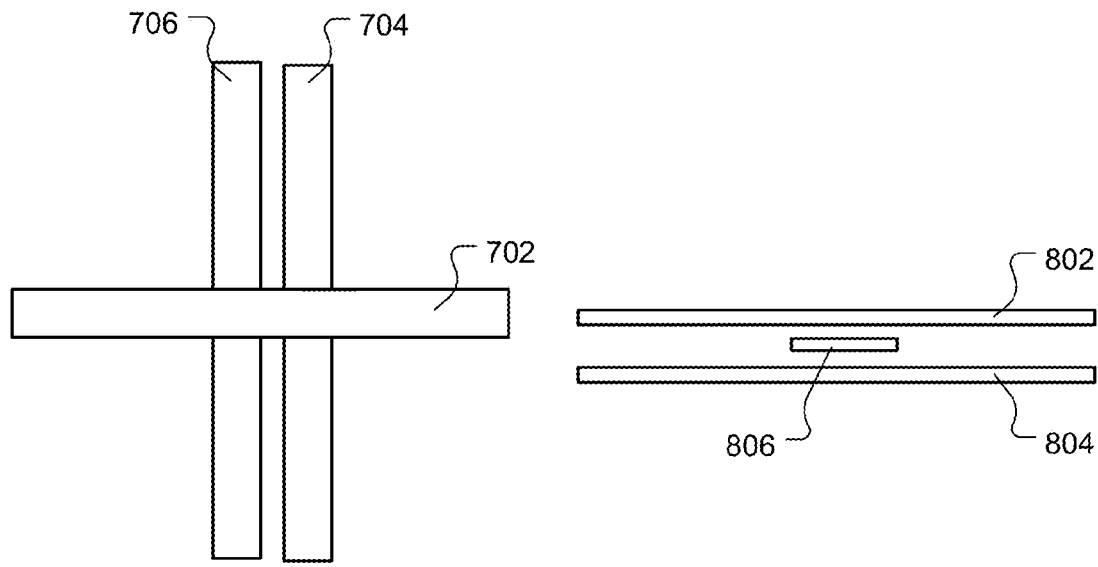
FIG. 7
FIG. 8

US 8,729,412 B2

NANOELECTROMECHANICAL LOGIC DEVICES

This application is a continuation in part and claims the benefit of U.S. patent application Ser. No. 12/943,575 U.S. Pat. No. 8,563,885 filed on Nov. 10, 2010, which claims benefit of non-provisional of U.S. Provisional Patent Application Ser. No. 61/260,283 filed on Nov. 11, 2009, each of which is hereby incorporated by reference for all purposes.

This invention was made with government support under Award #NBCH1090003 awarded by the U.S. Department of the Interior. The government has certain rights in this invention.

FIELD

The present application relates to nanoelectromechanical devices. More particularly, the present application relates to nanoelectromechanical logic devices.

BACKGROUND

Semiconductor transistors have been a mainstay of the electronics industry. Capable of being inexpensively mass produced, many integrated circuits comprise millions or billions of transistors. As the transistors are scaled down various effects (e.g., gate leakage current, etc.) inadvertently increase the standby power and reduce the ability of the scaled transistor to be completely switched making scaling below 10 nm gate length problematic. The off-to-on resistance ratio in transistors is relatively low and as the transistors scale down their off resistance becomes lower, in turn further reducing their off-to-on resistance ratio. Conduction through semiconductors also is affected as a function of temperature and radiation making silicon electronics, especially when scaled down to 10-30 nm gate lengths, severely problematic at elevated temperatures and in environments with cosmic and other (nuclear) radiation.

While various alternative types of devices other than semiconductor transistors have been under consideration, none have yet been able to replace the ubiquitous semiconductor transistor. Alternate device types can suffer limitations due to high switching voltages, low speed, large real-state area, difficulty in fabrication, and limited temperature operating ranges among other factors.

Mechanical switches have inherent radiation resistance, very high off-to-on resistance ratio and very low on resistance. Unfortunately, mechanical switches tend to be bulky and large, slow and unreliable with large turn on voltage and varying contact resistance.

SUMMARY

In some embodiments of the present invention a nanoelectromechanical logic device is provided. The device can include a first flexible bridge and a second flexible bridge. The first flexible bridge can have a first control electrode and a first logic electrode. The second flexible bridge can have a second control electrode and a second logic electrode. Voltages applied between the first and second control electrodes can cause the bridges to flex. The bridges can flex toward each other to cause the first logic electrode to make electrical contact with the second logic electrode.

In some embodiments of the present invention a method of operating a nanoelectromechanical logic device is provided. The method can include providing a logic device which includes a plurality of flexible bridges, a plurality of control electrodes disposed on the bridges, and a plurality of logic electrodes disposed on the bridges. Application of a first voltage pattern to the control electrodes can cause first ones of the bridges to flex and make electrical contact between a first set of logic electrodes. Application of a second voltage pattern to the control electrodes can cause a second set of the bridges to flex and make electrical contact between a second set of logic electrodes.

In some embodiments of the present invention a method of making a nanoelectromechanical logic device is provided. The device can be constructed on a substrate. The method can include depositing sacrificial material on the substrate and depositing structural material on the substrate, wherein at least a portion of the structural material is supported by the sacrificial material. Electrodes can be defined. The sacrificial material can be removed so that the structural material defines a first bridge and a second bridge, wherein the electrodes are coupled to the bridges.

BRIEF DESCRIPTION OF THE DRAWINGS

Additional features and advantages of the invention will be apparent from the detailed description which follows, taken in conjunction with the accompanying drawings, which together illustrate, by way of example, features of the invention; and, wherein:

FIG. 1D is an exploded perspective view of the device of FIG. 1A.

FIG. 1E is a detailed bottom view of the first bridge of the device of FIG. 1A.

FIG. 1F is a detailed top view of the second bridge of the device of FIG. 1A.

FIG. 5 is side cross section view of another nanoelectromechanical logic device in accordance with some embodiments of the present invention.

FIG. 6 is a schematic illustration of an adder in accordance with some embodiments of the present invention.

FIG. 7 is a top view of a nanoelectromechanical logic device having three bridges in accordance with some embodiments of the present invention.

FIG. 8 is a side cross section view of another nanoelectromechanical logic device having three bridges in accordance with some embodiments of the present invention.

DETAILED DESCRIPTION

Figure 1A:
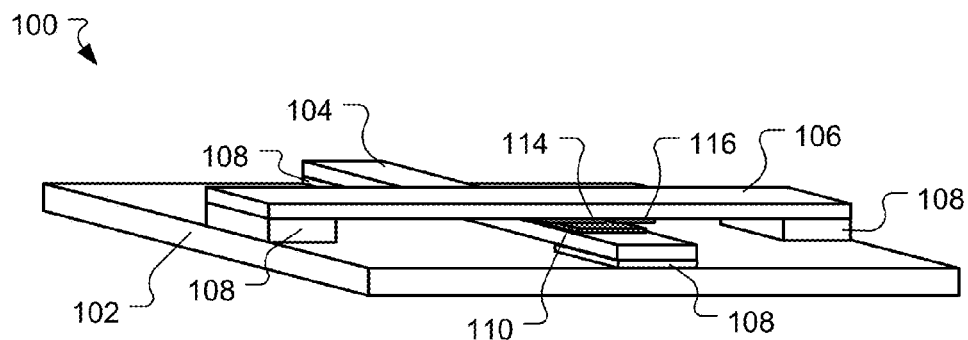
FIG. 1A is a perspective illustration of a nanoelectromechanical (NEMS) logic device in accordance with some embodiments of the present invention.
Figure 1B:
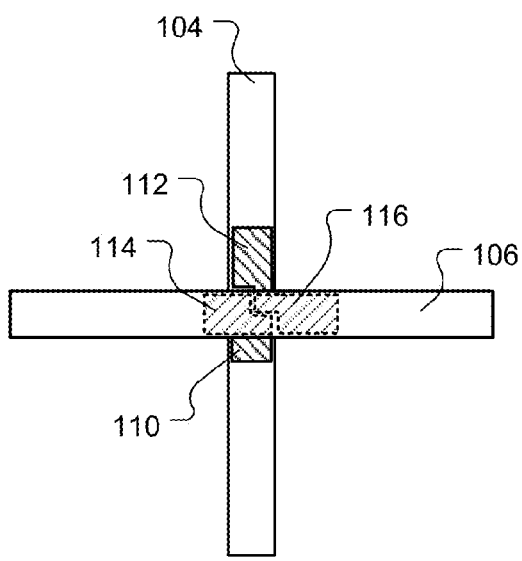
FIG. 1B is a top view of the device of FIG. 1A.
Figure 1C:
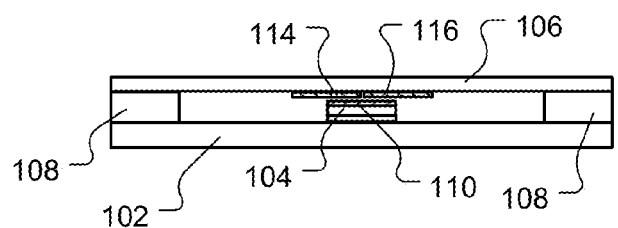
FIG. 1C is a side cross section view of the device of FIG. 1A.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In describing the present invention, the following terminology will be used:

The singular forms "a," "an," and "the" include plural referents unless the context clearly dictates otherwise. Thus, for example, reference to an item includes reference to one or more of the items.

As used herein, the term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art.

By the term "substantially" is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Numerical data may be expressed or presented herein in a range format. It is to be understood that such a range format is used merely for convenience and brevity and thus should be interpreted flexibly to include not only the numerical values explicitly recited as the limits of the range, but also interpreted to include all the individual numerical values or sub-ranges encompassed within that range as if each numerical value and sub-range is explicitly recited. As an illustration, a numerical range of "about 1 to 5" should be interpreted to include not only the explicitly recited values of about 1 to 5, but also include individual values and sub-ranges within the indicated range. Thus, included in this numerical range are individual values such as 2, 3, and 4 and sub-ranges such as 1-3, 2-4, and 3-5, etc. This same principle applies to ranges reciting only one numerical value and should apply regardless of the breadth of the range or the characteristics being described.

As used herein, a plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items.

As used herein, the term "alternatively" refers to selection of one of two or more alternatives, and is not intended to limit the selection to only those listed alternatives unless the context clearly indicates otherwise.

One promising area for developing new device types is that of nanoelectromechanical systems (NEMS). In particular, NEMS devices can be used to develop logic gates. FIGS. 1A-1F illustrate a NEMS logic device that can provide an exclusive-or function. The device, shown generally at 100, can include two bridges 104, 106 which can be supported by a substrate 102. The bridges can be flexible, and can be suspended above the substrate. For example, the bridges can be supported by pillars 108. Alternatively, the bridges can be suspended over a hollowed out (not shown) portion of the substrate.

As best seen in exploded view of FIG. 1D and the views of the individual bridges in FIGS. 1E-1F, the bridges can include control electrodes and logic electrodes. The first bridge 104 can include a first control electrode 110 and a first logic electrode 112. The second bridge 106 can include a second control electrode 114 and a second logic electrode 116. The first logic electrode and the second logic electrode are positioned at least partially opposite each other such that, when the bridges are flexed sufficiently, the logic electrodes can make electrical contact with each other. For example, the electrical contact can be an Ohmic contact having a resistance of 10 Ohms or less.

The bridges 104, 106 can flex in response to electrostatic force developed in response to voltages applied to the control electrodes 110, 114. For example, when a sufficient voltage difference is applied between the first control electrode 110 and the second control electrode 114, the resulting voltage difference can cause electrostatic attraction between the control electrodes. This can cause the bridges to flex toward each other until contact is made between the logic electrodes 112, 116. In turn, applying the same voltage to the bridges can result in the bridges relaxing to their normal position, breaking the contact between the logic electrodes. In other words, the bridges can move elastically in response to electrostatic forces applied by the control electrodes. Electrical contact between the control electrodes can be avoided by covering one or both of the control electrodes with an insulating layer. As another example, the control electrodes can be positioned so that they do not contact (e.g., placed in a position where one or both bridges are between the electrodes).

The device 100 can thus provide a logical-xor (exclusive-or) function as follows. Defining a first voltage (e.g., 0 V) as a logic 0, and defining a second voltage (e.g., 1V) as a logic 1, the following truth table is provided:

| Control Electrode 1 | Control Electrode 2 | Logic Element 1 to Logic Element 2 |
|---|---|---|
| 0 | 0 | Open |
| 0 | 1 | Closed |
| 1 | 0 | Closed |
| 1 | 1 | Open |

A logical-not (inversion) function can be provided by the logical-xor gate. For example, one logic electrode can be supplied a fixed voltage.

The NEMS logic device 100 can be an extremely compact implementation of a logical-xor gate. In transistor-implemented logic devices, typically 8 transistors are used to implement the exclusive-or function, in contrast to a single device as shown here. Accordingly, in some embodiments of the invention, smaller area and improved yield may be obtained as compared to conventional transistor devices.

As a particular example, the device can be constructed using bridges which can have a thickness between about 0.1 micrometer to about 3 micrometers. The bridges can have a width between about 1 to about 10 micrometers and a length between about 10 to about 100 micrometers. The gap between the bridges can be between about 1 nanometer to about 50 nanometers. The foregoing dimensions are examples only, and devices with one or more dimensions outside the foregoing ranges can also be used.

As a specific example, for devices having bridges separated by a few nanometers, actuation voltages can be relatively low, for example, less than about 10 volts. In part, these low voltages can be obtained due to several factors: proximity of the bridges, image effects, and use of two moving parts (rather than a single moving part).

Various materials can be used to construct the device. For example, the bridges can be formed of a dielectric material onto which a conductive material has been deposited to form the electrodes. For example, the bridges can be formed from silicon nitride, polysilicon, or the like. The electrodes can be formed from aluminum, tungsten, platinum, tungsten carbide, aluminum-nitrogen-oxygen, or the like. As another example, the electrodes can be formed from a semiconductor (e.g., doped silicon). Depending on the materials chosen for the electrodes, a substantially Ohmic contact can be formed when a pair of electrodes is brought into contact. For example, an Ohmic contact can provide a series resistance of about 10 Ohms or less. In contrast, when the electrodes are not in contact, very low leakage can be obtained. In part, low leakage can be obtained because of the gap between the electrodes.

Figure 2:
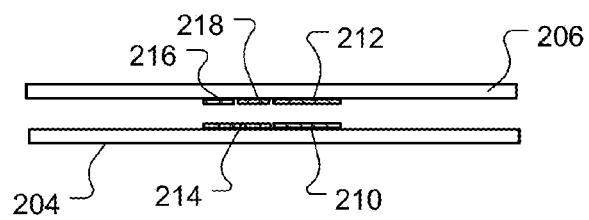
FIG. 2 is a side view illustration of another type of NEMS logic device in accordance with some embodiments of the present invention.

Various patterns of logic electrodes and control electrodes can be used on the bridges to provide differing logic functions. For example, FIG. 2 illustrates a side cross section view of a device 200 which can provide a logical-and function. The device can include two bridges 204, 206, which can be suspended above a substrate (not shown) in a similar manner as the device of FIG. 1. Disposed on the bridges can be logic electrodes 210 and 212, which can be like the logic electrodes 112, 116 of FIG. 1. Also disposed on the bridges can be control electrodes 214, 216, 218. The logic electrodes can be positioned so that they make electric contact when the bridges flex toward each other. Two of the control electrodes 216, 218 can be disposed on one of the bridges and the other control electrode 214 can be disposed on the other bridge.

Operation of the device 200 uses electrostatic force developed between the control electrodes 213, 216, 218 to control flexing of the bridges 204, 206. A voltage can be applied to the first electrode 214 (e.g., ground potential). When a sufficiently large voltage is applied to both the second electrode 216 and the third electrode 218 (e.g., between about 0.5 volts to about 2 volts) relative to the first electrode, this can cause the bridges to flex toward each other causing the logic electrodes 210, 212 to make electrical contact. When one or both of the second and third electrodes are the same voltage as the first electrode, the bridges can relax breaking the electrical contact. Thus, it can be seen that the device can implement the logical-and function of the voltages applied to the second electrode and third electrode.

The device 200 can be an extremely compact implementation of a logical-and gate. In transistor-implemented logic devices, typically 4 transistors are used to implement the logical-and function, in contrast to a single device as shown here. Accordingly, in some embodiments of the invention, smaller area and improved yield may be obtained as compared to conventional transistor devices.

Figure 3:
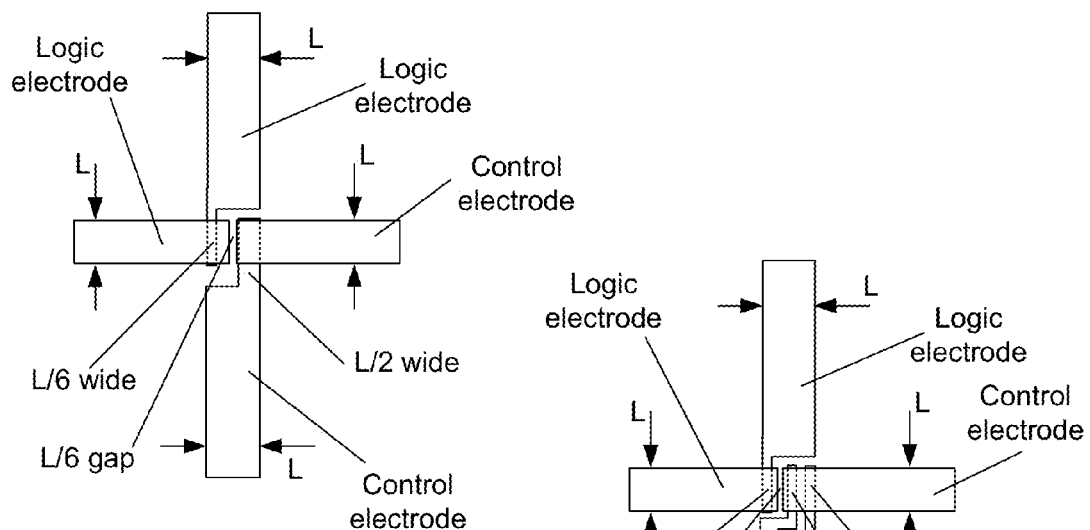
FIG. 3 is a top view of an electrode pattern for a logical-xor gate in accordance with some embodiments of the present invention.
Figure 4:
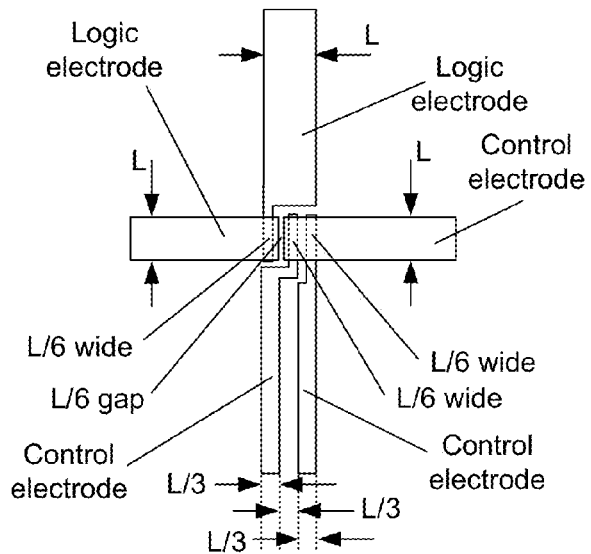
FIG. 4 is a top view of an electrode pattern for a logical-and gate in accordance with some embodiments of the present invention.

While particular arrangements of electrodes have been shown in FIG. 1 and FIG. 2, many other arrangements can be used, including for example differing geometric shapes and patterns. For example, FIG. 3 illustrates a top view of electrode patterns than can be used on a pair of crossed bridges to provide a logical-xor gate. FIG. 4 illustrates a top view of electrode patterns than can be used on a pair of crossed bridges to provide a logical-and gate. The device dimensions are shown as a ratio of a basic bridge width L, which can for example be, less than 10 micrometers. As another example, L can be in the range of 1 micrometer to 100 micrometers.

Electrodes can also be provided on the substrate. For example, FIG. 5 illustrates a device 500 which has a pair of crossed bridges 502, 504. In addition to electrodes 506, 508 disposed on the bridges (which can be control electrodes or logic electrodes), an electrode 510 can be disposed on the substrate. The electrode 510 on the substrate can be used for several purposes. For example, the electrode can be used as an additional control electrode. The electrode can, for example, be used to help separate the bridges if they are sticking together (e.g., by providing a pull-down force on the lower bridge 504).

Multiple logic devices can be used to provide more complex logic functions. For example, three logical-xor gates and two logical-and gates can be combined to form an adder with a carry in and carry out as shown schematically in FIG. 6. The resulting adder requires only 5 NEMS logic devices, in contrast to a conventional complementary metal-oxide-semiconductor (CMOS) transistor implementation which would require 8 CMOS switch devices. Accordingly, smaller integrated circuits can be produced using NEMS devices as disclosed herein. Using NEMS devices as disclosed herein, reduction in device counts of about 3 to 4 over conventional CMOS devices can be obtained.

More complex devices which include additional electrodes and/or additional bridges can also be constructed. For example, FIG. 7 a top view of a device having three crossed bridges. A first bridge 702 is suspended over a second bridge 704 and third bridge 706. Because the second bridge and third bridge can flex independently of each other, more complex logic functions can be implemented in such a device. As another example, FIG. 8 illustrates a side view of a device having three bridges, where two bridges 802, 804 are disposed on each side of a crossed bridge 806.

The crossed bridges of NEMS logic devices can be perpendicular to each other, although this is not essential, and angles other than 90 degrees can be used. Depending on the pattern of control electrodes and logic electrodes, a variety of different logic functions can be implemented. Thus, in some embodiments, a NEMS logic device can include a plurality of suspended, flexible bridges. Some of the bridges can overlap each other. Disposed on the bridges can be a plurality of control electrodes. Pairs of control electrodes can be disposed opposite each other to allow controlling the flexing of corresponding bridges. Control electrodes can also be disposed on the substrate opposite one or more control electrodes on the bridges. A plurality of logic electrodes can also be disposed on the bridges. The logic electrodes can be electrically isolated from the control electrodes. Logic and control can be disposed on either or both side of the bridges. For example, a logic electrode and a control electrode can be disposed on the same side of the bridge. As another example, a logic electrode can be disposed on the opposite side of a bridge from a control electrode. The control electrodes can be used to cause bridges to flex toward each other, or to cause bridges to flex away from each other. Flexure of bridges can cause electrical contacts between corresponding pairs of logic electrodes to be opened or closed. A pattern of voltages placed onto the control electrodes can cause one or more of the bridges to flex, in turn causing one or more pairs of logic electrodes to make electrical connection. A different pattern of voltages placed on the control electrodes can cause different ones of the bridges to flex, in turn causing different pairs of logic electrodes to make electrical connection.

For example, as described above, in some embodiments certain arrangements of control electrodes can provide for an exclusive-or function or a logical-and function. In some embodiments it may be possible to provide a logical-or, logical-nand, logical-nor, or other logical functions by appropriate positioning and biasing of the electrodes.

Figure 9:
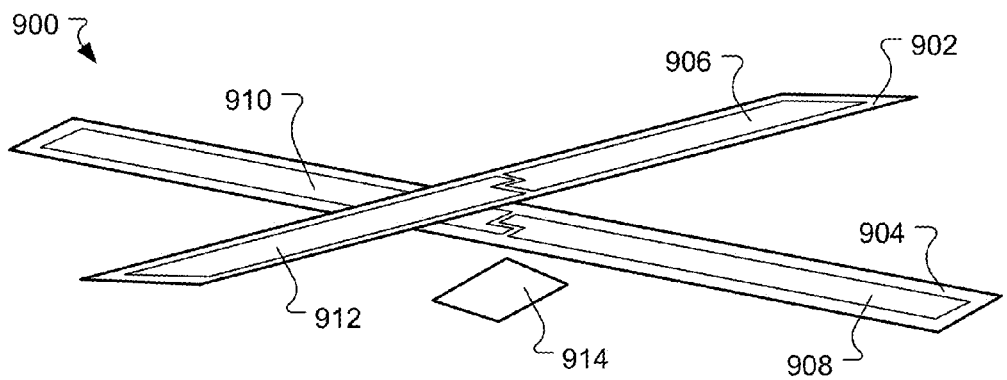
FIG. 9 is a perspective illustration of a nanoelectromechanical logic device having a control electrode disposed on the substrate in accordance with some embodiments of the present invention.

By inclusion of a magnetic element, latching behavior can be obtained which can be useful as a memory. For example, FIG. 9 illustrates a device 900 which can operate as a 1-bit memory. Disposed on two bridges 902, 904 are control electrodes 906, 908 and logic electrodes 910, 912. The control electrodes 906, 908 can be used to cause the bridges to flex as described above, making contact between the logic electrodes. The bridges and/or electrodes can include a magnetic material which causes the bridges to latch together when they are sufficiently close. For example, the magnetic material can be $NiOFe_2O_3$ or other suitable material. Accordingly, once a sufficient voltage potential (e.g., greater than about 2 volts) has been applied between the control electrodes 906, 908, the bridges can flex together and make contact.

The device 900 also includes an additional electrode 914 on the substrate (not shown). This additional electrode can be used to separate the bridges 902, 904 when desired. For example, providing a sufficient voltage potential between control electrodes 908, 914 can cause electrostatic attraction between the lower bridge 904 and the substrate sufficient to overcome the magnetic latching force, allowing the lower bridge to move downward and break contact between the logic electrodes 910, 912.

Figure 10:
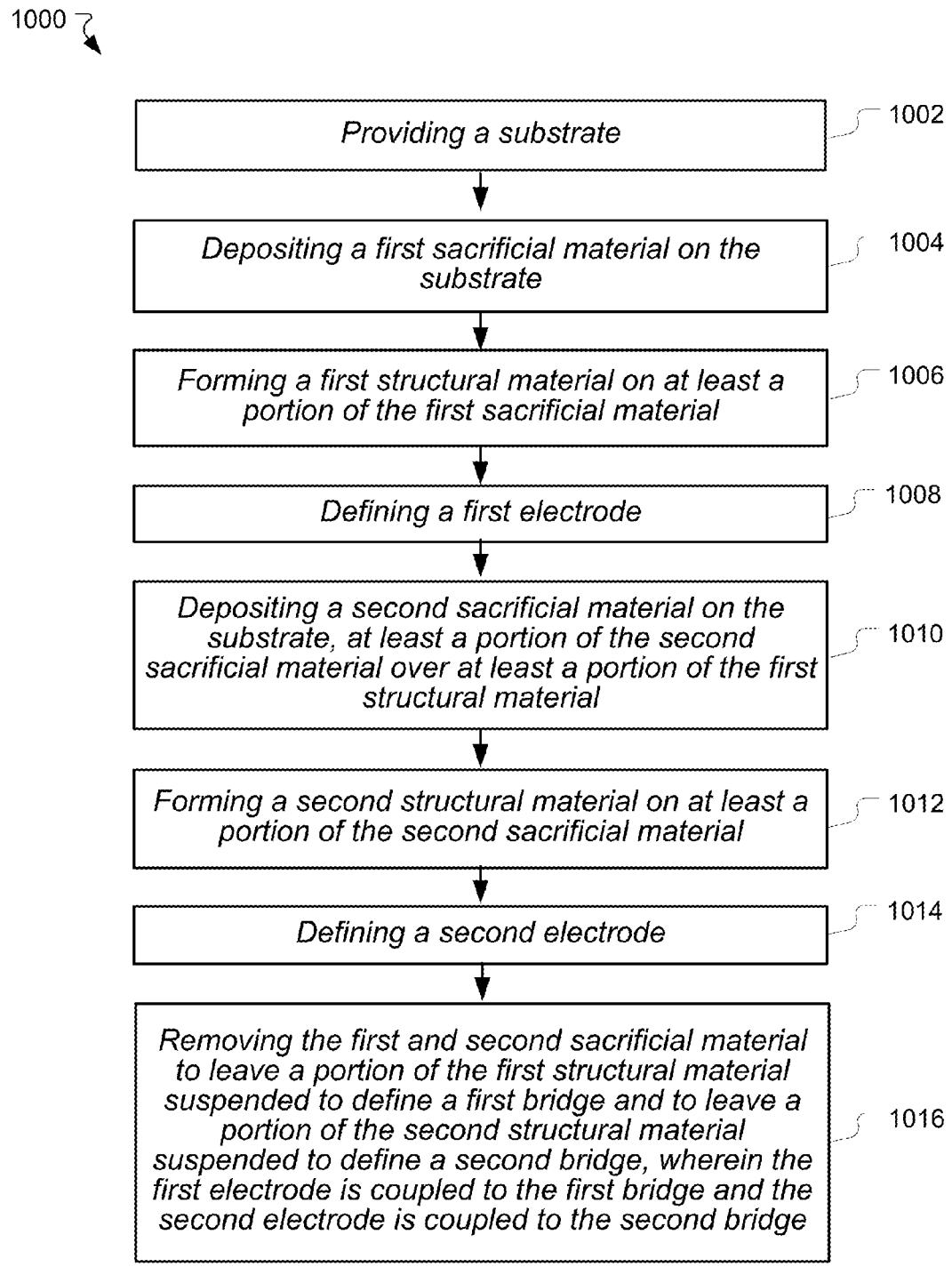
FIG. 10 is a flow chart of a method for making a nanoelectromechanical logic device in accordance with some embodiments of the present invention.

Turning to FIG. 10, a method for making a NEMS logic device, such as for example devices described above, is illustrated. A device 1100 being constructed according to the method is illustrated in FIGS. 11A-11E.

Turning to FIG. 10, a first operation in the method can include providing 1002 a substrate. For example, the substrate can be an insulating material, an insulating layer disposed on a semiconductor material or conductive material, a semiconductor material, etc. as described above. For example, a silicon wafer can be used for fabrication of devices. An insulating layer (e.g., silicon dioxide) can be formed on the wafer. The silicon wafer can have various electronic devices (e.g. transistors) already fabricated thereon.

The method 1000 can include depositing 1004 a first sacrificial material on the substrate. For example, the sacrificial material can be formed by dry oxide formation. As another example, the sacrificial material can be formed using a self assembled monolayer such as dodecanethiol. The sacrificial material can be an etchable material, and can have a thickness of less than about 10 nm. For example, the sacrificial material can be deposited using atomic layer deposition. The first sacrificial material can serve as a temporary support on which additional structures are fabricated as described further below.

Figure 11A:
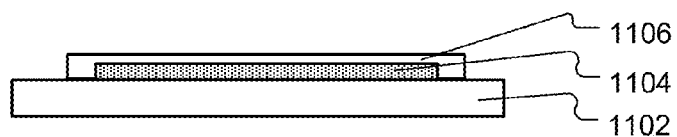
FIGS. 11A-11D are illustrations of a nanoelectromechanical logic device in various stages of being fabricated in accordance with some embodiments of the present invention.

The method 1000 can also include forming 1006 a first structural material on at least a portion of the first sacrificial material. The first structural material can, for example, form a bridge, after the sacrificial material is removed as described further below. The first structural material can be polysilicon, silicon nitride, or other materials. Deposition can use physical vapor deposition, chemical vapor deposition, sputtering, or other techniques. The first structural material can be patterned. For example, the patterning can be performed by using photolithography, wherein a photosensitive mask layer is deposited, exposed, cured, and then developed to remove portions of the mask. Material can then be deposited or etched (e.g. through removed portions of the mask). Various alternative photolithographic processes can be used including: negative resists, positive resists, deposition onto a mask, etching through a mask, and liftoff. FIG. 11A illustrates a substrate 1102 which has a sacrificial material 1104 and a first structural material 1106 disposed thereon.

Figure 11B:
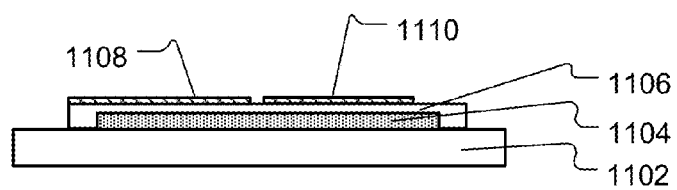

The method 1000 can also include defining 1008 a first electrode. The first electrode can be an electrically conductive material, including for example: aluminum, nickel, platinum, tungsten, carbide, or combinations and alloys thereof, or other materials. As another example, the first electrode can be a semiconductor material (e.g., doped semiconductor). The first electrode can be electrically conductive material deposited or patterned on to the first structural material. As another example, the first electrode can be deposited or patterned onto the sacrificial material before the first structural material is deposited. FIG. 11B illustrates a partially constructed device, where a first electrode 1108 and a third electrode 1110 have been deposited and patterned onto the first structural material 1106.

The method 1000 can also include depositing 1010 a second sacrificial material, at least a portion of which is over at least a portion of the first structural material. For example, the second sacrificial material can be the same material as the first sacrificial material.

The method 1000 can also include forming 1012 a second structural material on at least a portion of the second sacrificial material. The second structural material can for example, form a bridge, after the sacrificial material is removed as described further below. For example, the second structural material can be the same as the first structural material. The second structural material can also be patterned.

Figure 11C:
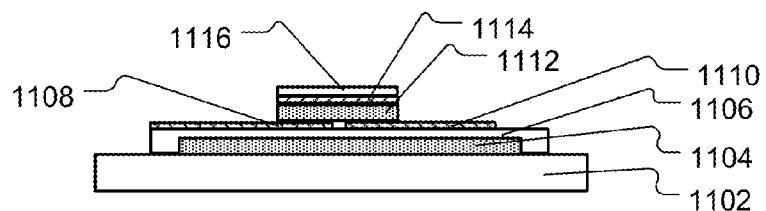

The method 1000 can also include defining 1014 a second electrode. For example, the second electrode can be the same material as the first electrode. The second electrode can be patterned. The second electrode can be deposited onto the second structural material after the second structural material is formed. As another example, the second electrode can be deposited onto the second sacrificial material before the second structural material is formed. FIG. 11C illustrates the partially constructed device, where the second electrode 1114 has been deposited and pattered onto the second sacrificial material 1112, and the second structural material 1116 has been formed as well.

Figure 12:
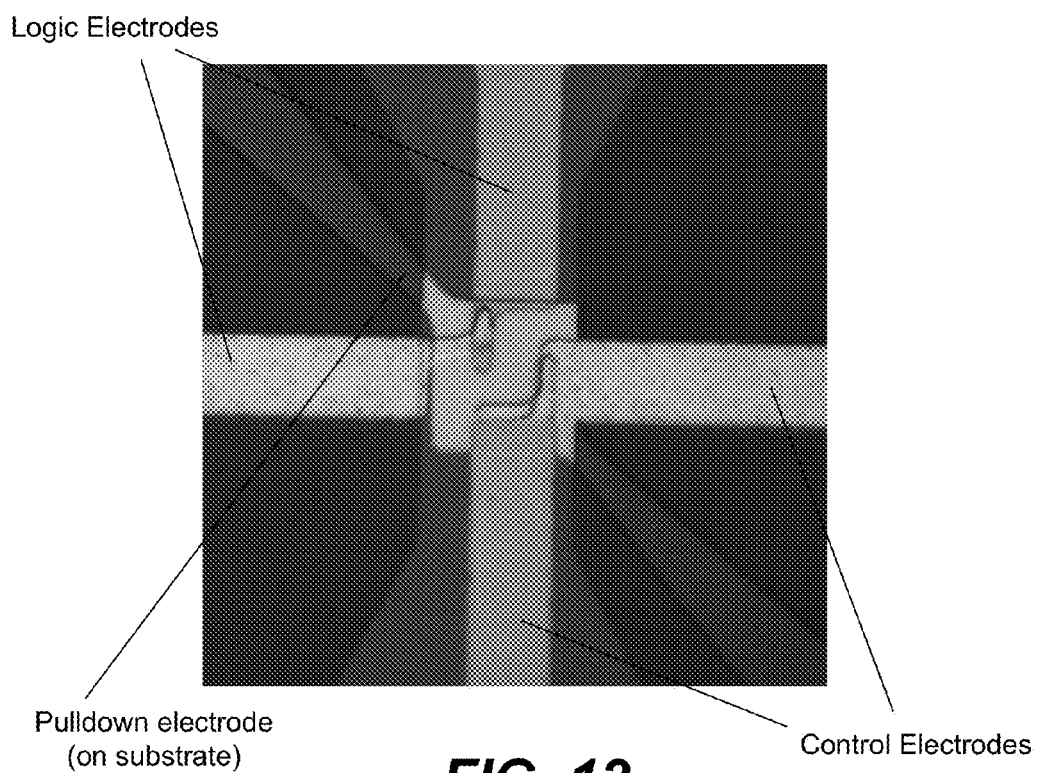
FIG. 12 is an electron microscope picture of a nanoelectromechanical logic device in accordance with some embodiments of the present invention.
Figure 11D:
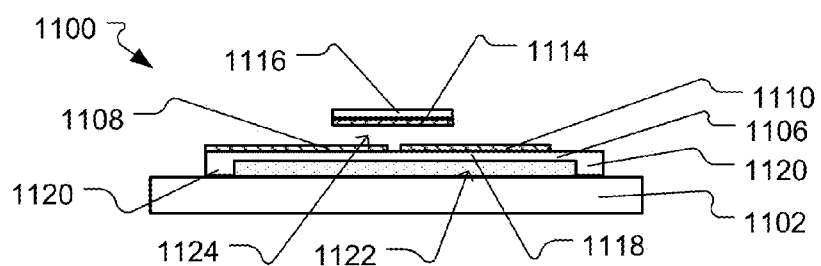

The method 1000 can also include removing 1016 the first and second sacrificial material. This can leave portions of the first and second structural material suspended, thereby defining bridges having electrodes coupled thereto. FIG. 11D illustrates the completed device 1100. The first structural material 1106 defines a first bridge having a span portion 1118 suspended by pillars 1120 at the ends, and separated from the substrate 1002 by a gap 1122. The second structural material 1116 defines a second bridge (seen in cross section view) separated from the first bridge by a gap 1124. FIG. 12 provides an electron microscope picture of NEMS XOR device having an electrode geometry similar to that of FIG. 3.

While one example of a method has been illustrated, various other operations can be included in the method. For example, additional layers of material (e.g., conductive material, insulating material, etc.) can be provided. For example, insulating material can be deposited adjacent (e.g., immediately before or immediately after) the electrode materials are deposited to provide insulated electrodes. As another example, conductive material can be deposited to define electrical interconnections.

Multiple devices on a single substrate can be fabricated simultaneously. Moreover, interconnections between devices can be formed by depositing and patterning additional conductive material to connect electrodes of the devices together. Interconnections can be formed at the same time as defining the first electrode, defining the second electrode, and in additional steps of depositing/patterning electrically conductive material. Accordingly, multiple devices can be combined on a single substrate into an integrated circuit.

The forgoing fabrication operations are similar to and compatible with operations used to form semiconductor devices. Accordingly, NEMS logic devices can be constructed at the same time as portions (e.g., metallization layers) of a conventional semiconductor device. As another example, NEMS devices can be constructed on top of completed semiconductor devices (e.g., on top of an insulating layer). Interconnection of the NEMS logic devices and semiconductor devices can be performed using interconnection as discussed above.

In some embodiments of the invention, devices can be capable of operating for extended periods of time (e.g., greater than 1 hour) at elevated temperatures (e.g., above 600 degrees C.). In part this can be possible by avoiding the need for semiconductor materials which can rapidly form defects and electrically degrade at high temperatures.

While several illustrative examples and applications have been described, many other examples and applications of the presently disclosed techniques may prove useful. Accordingly, the above-referenced arrangements are illustrative of some applications for the principles of the present invention. It will be apparent to those of ordinary skill in the art that numerous modifications can be made without departing from the principles and concepts of the invention as set forth in the claims.

What is claimed is:

1. A nanoelectromechanical logic device, comprising:
a substrate;
a first flexible bridge structure supported by and suspended above the substrate;
a first control electrode disposed on the first bridge;
a first logic electrode disposed on the first bridge;
a second flexible bridge structure supported by and suspended above the substrate and overlapping at least a portion of the first bridge structure;
a second control electrode disposed on the second bridge; and
a second logic electrode disposed on the second bridge, wherein the second logic electrode is positioned opposite the first logic electrode so that the first logic electrode and the second logic electrode make electrical contact with each other when the first bridge and the second bridge flex toward each other.

2. The device of claim 1, wherein the first control electrode and the second control electrode are opposite each other.

3. The device of claim 2, wherein a voltage between about 0.5 volts and about 2.0 volts applied between the first control electrode and the second control electrode causes the first bridge and the second bridge to flex toward each other.

4. The device of claim 1, wherein the first control electrode is opposite a third control electrode disposed on the substrate.

5. The device of claim 4, wherein a voltage between about 0.5 volts and about 2.0 volts applied between the first control electrode and the third control electrode causes the first bridge to flex toward the substrate.

6. The device of claim 1, further comprising a third control electrode disposed on the first bridge, and wherein the second control electrode is opposite both the first control electrode and the third control electrode.

7. The device of claim 6, wherein the first bridge and second bridge flex toward each other in response to both a first voltage between about 0.5 volts and about 2.0 volts being applied between the first control electrode and the second control electrode, and a second voltage difference between about 0.5 volts and about 2.0 volts being applied between the third control electrode and the second control electrode.

8. The device of claim 1, further comprising a magnetic element disposed on the first bridge.

9. The device of claim 1, wherein:
the first bridge and the second bridge each comprise a dielectric material selected from the group consisting of: silicon nitride and polysilicon; and
the first logic terminal and the second logic terminal each comprise a conductive material chosen from the group consisting of: aluminum, platinum, tungsten, chromium, tungsten carbide, aluminum-nitrogen-oxygen, or combinations and alloys thereof.

10. The device of claim 1, wherein the device is integrated with a semiconductor transistor on the same substrate.

11. The device of claim 1, wherein the first bridge and the second bridge are separated by a gap of between 1 nanometer and 10 nanometers.

12. The device of claim 1, wherein the first bridge and the second bridge are substantially perpendicular to each other.

13. A method of operating a nanoelectromechanical logic device, the method comprising:
providing a nanoelectromechanical logic device, wherein the device comprises:
a plurality of suspended, flexible bridge structures;
a plurality of control electrodes disposed on the plurality of suspended, flexible bridge structures, wherein at least one pair of the plurality of control electrodes are at least partially opposite each other;
a plurality of logic electrodes disposed on the plurality of suspended flexible bridge structures, wherein at least one pair of the plurality of logic electrodes are opposite each other;
applying a first voltage pattern to the plurality of control electrodes so that electrostatic force causes ones of the plurality of bridges to flex and make electrical contact between a first set of the plurality of logic electrodes;
applying a second voltage pattern to the plurality of control electrodes, the second voltage pattern being different than the first voltage pattern, so that electrostatic force causes different ones of the plurality of bridges to flex and make electrical contact between a second set of the plurality of logic electrodes, wherein the second set is different than the first set.

14. The method of claim 13, wherein the first set and the second set correspond to the logical-exclusive-or function of the first pattern and the second pattern.

15. The method of claim 13, wherein the first set and the second set correspond to the logical-and function of the first pattern and the second pattern.

16. The method of claim 13, further comprising magnetically latching ones of the plurality of bridges together.

17. The method of claim 16, further comprising applying sufficient electrostatic force to overcome the magnetically latching.

* * * * *

UNITED STATES PATENT AND TRADEMARK OFFICE
CERTIFICATE OF CORRECTION

PATENT NO. : 8,729,412 B2
APPLICATION NO. : 12/987804
DATED : May 20, 2014
INVENTOR(S) : Massood Tabib-Azar It is certified that error appears in the above-identified patent and that said Letters Patent is hereby corrected as shown below:

In the Specification:
At column 1, line numbers 10-13, delete the following paragraph:
"This invention was made with government support under Award #NBCH1090003 awarded by the U.S. Department of the Interior. The government has certain rights in this invention."
and insert the following paragraph:
--This invention was made with government support under NBCH109003 awarded by The Department of Defense – Defense Advanced Research Projects Agency. The government has certain rights in the invention.--

Signed and Sealed this
Sixteenth Day of June, 2015

Michelle K. Lee
*Director of the United States Patent and Trademark Office*

UNITED STATES PATENT AND TRADEMARK OFFICE
CERTIFICATE OF CORRECTION

PATENT NO.         : 8,729,412 B2
APPLICATION NO.    : 12/987804
DATED              : May 20, 2014
INVENTOR(S)        : Massood Tabib-Azar It is certified that error appears in the above-identified patent and that said Letters Patent is hereby corrected as shown below:

In the Specification:

At column 1, line numbers 10-13, delete the following paragraph:

"This invention was made with government support under Award #NBCH1090003 awarded by the U.S. Department of the Interior. The government has certain rights is this invention."

and insert the following paragraph:

--This invention was made with government support under NBCH1090003 awarded by the Department of Defense – Advanced Research Projects Agency. The government has certain rights in the invention.--

Signed and Sealed this
Twenty-fourth Day of May, 2016

Michelle K. Lee
*Director of the United States Patent and Trademark Office*